(12) United States Patent
Ong et al.

(10) Patent No.: US 11,508,650 B2
(45) Date of Patent: Nov. 22, 2022

(54) INTERPOSER FOR HYBRID INTERCONNECT GEOMETRY

(71) Applicant: Intel Corporation, Santa Clara, CA (US)

(72) Inventors: Jenny Shio Yin Ong, Bayan Lepas (MY); Seok Ling Lim, Kulim (MY); Bok Eng Cheah, Bukit Gambir (MY); Jackson Chung Peng Kong, Tanjung Tokong (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/023,042

(22) Filed: Sep. 16, 2020

(65) Prior Publication Data

US 2021/0183755 A1 Jun. 17, 2021

(30) Foreign Application Priority Data

Dec. 12, 2019 (MY) .............................. PI2019007426

(51) Int. Cl.
| | | |
|---|---|---|
| H01L 23/498 | (2006.01) | |
| H01L 21/48 | (2006.01) | |
| H01L 23/552 | (2006.01) | |
| H01L 23/64 | (2006.01) | |

(52) U.S. Cl.
CPC .... *H01L 23/49833* (2013.01); *H01L 21/4803* (2013.01); *H01L 21/4853* (2013.01); *H01L 23/49816* (2013.01); *H01L 23/49838* (2013.01); *H01L 23/552* (2013.01); *H01L 23/642* (2013.01)

(58) Field of Classification Search
None
See application file for complete search history.

(56) References Cited

U.S. PATENT DOCUMENTS

| | | | |
|---|---|---|---|
| 8,530,277 B2 * | 9/2013 | Ko | H01L 24/92 |
| | | | 438/109 |
| 2019/0273074 A1 * | 9/2019 | Cho | H01L 24/17 |
| 2021/0225829 A1 * | 7/2021 | Cho | H01L 23/5385 |
| 2021/0272919 A1 * | 9/2021 | Lin | H01L 24/17 |

* cited by examiner

*Primary Examiner* — Long Pham
(74) *Attorney, Agent, or Firm* — Schwegman Lundberg & Woessner, P.A.

(57) ABSTRACT

An electronic device and associated methods are disclosed. In one example, the electronic device includes a substrate, a semiconductor die thereon, electrically coupled to the substrate, and an interposer adapted to connect the substrate to a circuit board. The interposer can include a major surface, a recess in the major surface, a first plurality of interconnects passing through the interposer within the recess to electrically couple the substrate to a circuit board, and a second plurality of interconnects on the major surface of the interposer to electrically couple the substrate to the circuit board, wherein each of the second plurality of interconnects comprises a smaller cross-section than some of the first plurality of interconnects.

12 Claims, 6 Drawing Sheets

INTERPOSER FOR HYBRID INTERCONNECT GEOMETRY

This application claims the benefit of priority to Malaysian Application Serial No. PI2019007426, filed Dec. 12, 2019, which is incorporated herein by reference in its entirety.

TECHNICAL FIELD

Embodiments described herein generally relate to semiconductor packaging.

BACKGROUND

Semiconductor packaging can include interconnects between components that allow varying power densities and passive component attachment. It is desired to have interconnects of varying sizes that address these concerns, and other technical challenges.

DESCRIPTION OF EMBODIMENTS

Figure 1A:
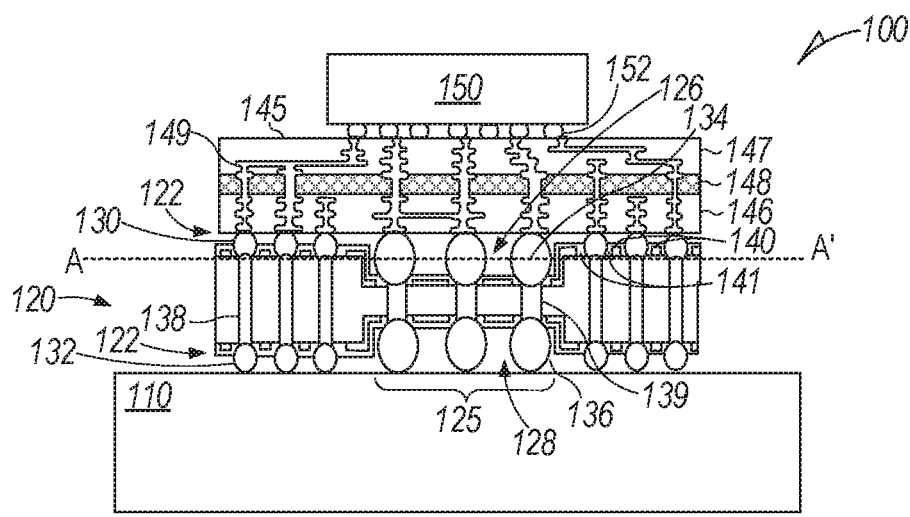
FIGS. 1A-1B are schematic diagrams of a semiconductor package with stepped interposer design in various embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Semiconductor package footprint miniaturization is desired so that the packaging fits into smaller hand-held electronic devices, or so that a larger quantity of electronic components e.g., batteries or memory storage devices can be accommodated in less overall space. However, some interconnects used in semiconductor packaging, such as ball grid array (BGA) geometries, require larger sizes to meet maximum current carrying capacity ($ICC_{MAX}$) requirements for power supplies.

Discussed herein is a semiconductor package design that incorporates stepped interposer design for a hybrid interconnect array and passive coupling for components. The design addresses the challenge of package footprint miniaturization that can occur where large interconnect geometry is used, such as solder balls with large diameters to place and connect passive components. Specifically, the design can incorporate interposers that have recesses to allow use of interconnects with varying diameters. In some examples, the recess(es) in the interposer can include capacitors to allow connection of the interconnects.

A stepped interposer can allow for larger interconnects near the central zones of the package for higher current carrying capacity, and additionally smaller interconnects near package peripherals for increased input output density. In some cases, a stepped interposer can allow for placement of decoupling capacitors or passive components in or near the stepped feature of the interposer.

The discussed devices and methods can produce a semiconductor package with increased footprint miniaturization through shrinking interconnect geometry, such as BGA with smaller diameter or pitch. A stepped interposer design can allow for varying sizes of BGA, including some with smaller diameter and more tightly packed while increasing input/output (I/O) density.

A stepped interposer design can additionally allow for larger interconnects, such as BGA with larger diameters, in a central portion of the semiconductor package to facilitate increased carrying capacity for the interconnects associated with power supply ($V_{cc}$).

Additionally, the discussed methods and devices can allow for improved signaling performance of a semiconductor package for high speed IO by reducing channel impedance discontinuity. Miniaturized interconnects can result in less capacitive vertical interconnects, helping to preserve transmission line impedance matching across the semiconductor package. Additionally, interconnect cross-talk can be reduced through a ground ($V_{ss}$) shield layer disposed across the surface(s) of the interposer.

Moreover, the discussed methods and devices can allow for improved power integrity performance by reducing power loop inductance. The discussed semiconductor package design can allow for shorter interconnect pathways between power delivery decoupling capacitors and power supply ($V_{cc}$) interconnects in a central portion of the package.

Reduced power loop inductance between the circuitry and associated power ($V_{cc}$) and ground ($V_{ss}$) networks of interconnects across the semiconductor package can suppress power delivery network impedance, reducing power supply induced jitters.

Figure 1B:
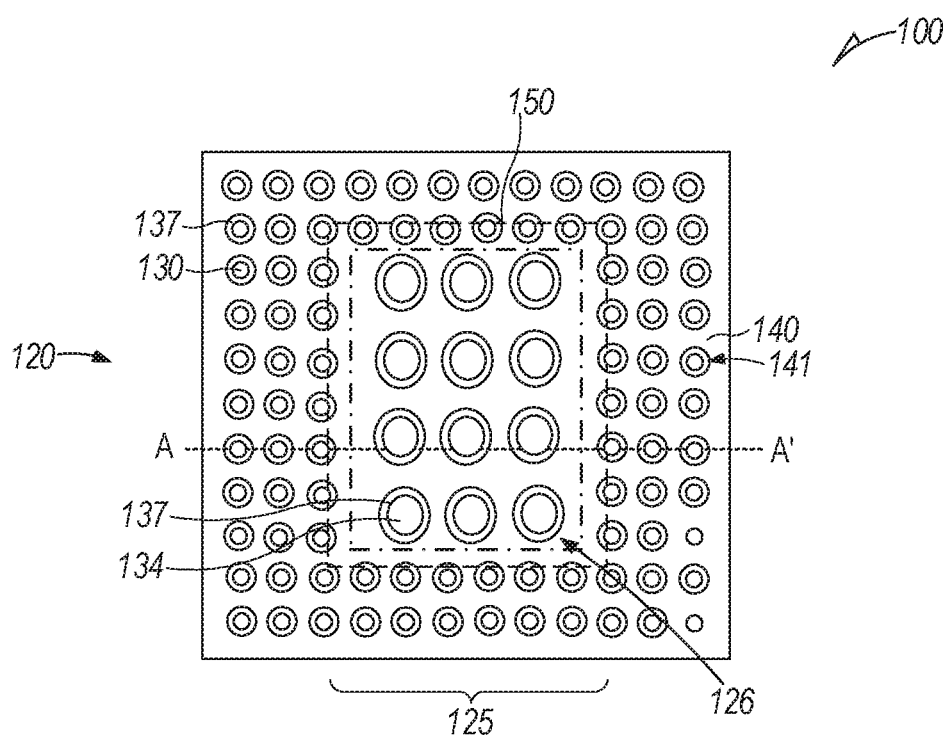

FIGS. 1A-1B are schematic diagrams of a semiconductor package 100 with a stepped interposer design in various embodiments. FIG. 1A shows a side view, while FIG. 1B shows a top-down view. FIGS. 1A-1B will be discussed together.

Semiconductor package 100 can include circuit board 110, interposer 120, package substrate 145, and semiconductor die 150. Interposer 120 can include first side 122, second side 124, first recess 126, central portion 125, second recess 128, first BGA 130, second BGA 132, third BGA 134, fourth BGA 136, contact pads 137, vertical interconnects 138, 139, and shield layer 140 with dielectric layer 141. Package substrate 145 can include first side 146, second side 147, dielectric layer 148, and traces 149, and semiconductor die 150 can include interconnects 152.

In package 10, circuit board 110 hosts semiconductor die 150 through package substrate 145 and interposer 120. Semiconductor die 150 is physically and electrically coupled to package substrate 145 through interconnects 152. Interposer 120 connects package substrate 145 to circuit board 110. On interposer 120, ball-grid arrays (BGA) 130, 134, connect to package substrate 145 on land side 122 of interposer 120. BGA 132, 136 connect to circuit board 110 on second side 124 of interposer 120.

Circuit board 110 can be, for example, a printed circuit board (PCB) that mechanically and electrically supports components in assembly 100, or another type of motherboard. Circuit board 110 can contain single, double, or multiple layers. Circuit board 110 can host traces of conductive material (e.g., copper trace), in addition to pads of conductive material to allow for electrical connection. Circuit board 110 can additionally host vertical connectors, such as, for example, via, micro-via, or plated through holes (PTH). Circuit board 110 may host and support additionally components, semiconductor dies, or connectors, not shown in FIGS. 1A-1B.

Interposer 120 can be, for example, an organically molded interposer. Interposer 120 can be sized so that interposer 120 aligns with substrate 145. Interposer 120 can have two main surfaces: land side surface 122 and other side surface 124, opposite each other. Surface 122 can be adjacent substrate 145, while surface 124 can be adjacent circuit board 110.

Interposer 120 can have a stepped feature created by recesses 126, 128, towards central portion 125 of surfaces 122, 124, of interposer 120. Recesses 126, 128, can extend at least partially into interposer 120. Recesses 126, 128, can allow for differing sizes of interconnects between substrate 145 and interposer 120, and/or between circuit board 110 and interposer 120. These interconnects can be, for example, a ball grid array (BGA), via, traces, or other types of interconnects. Shown in FIGS. 1A to 1B, several BGAs can be used as interconnects, however, other types of interconnects are envisioned.

In some embodiments, the interconnects can be, for example, solder balls, such as ball grid arrays (BGA) made of conductive solder in an appropriate pattern to create electrical connections. Solder balls can be connected via solder ball pads, made of a conductive and/or metallic material, such as copper. In order to make solder balls with larger diameter (i.e., wider), the solder balls must also be taller. This is due to surface tension of the solder ball material. For this reason, a recess can be a convenient solution to provide a "taller" space in which larger solder balls can reside. Wider solder balls additionally have a lower resistance, and thus can address the hot spot problems discussed above. The BGA can be underfilled with an appropriate adhesive, such as, for example, epoxy or other adhesive as known in the art.

In FIGS. 1A-1B, interposer 120 can include a hybrid interconnect geometry encompassing more than one size of interconnect BGA. For example, in package 100, there are four BGAs 130, 132, 134, 136.

First and second BGA 130, 132, can be situated on major surfaces 122, 124 of interposer 120. First and second BGA 130, 132, can be made of a number of solder balls, each having a cross-section smaller in diameter to allow for tight connection between surface 122 and substrate 145, and between surface 124 and circuit board 110, respectively. Each of the solder balls in the first and second BGA 130, 132, can have diameters of about 1 mil to about 4 mils. Each of the first and second BGA 130, 132 can carry an electrical signal and/or reference voltage through interposer 120 between substrate 145 and circuit board 110. For example, the BGA 130, 132 can direct a ground ($V_{ss}$) or power ($V_{cc}$) reference voltage through interposer 120.

Third and fourth BGA 134, 136, are situated in recesses 126, 128, respectively, near central portion 125 of surfaces 122, 124. Third and fourth BGA 134, 136, can each include one or more solder balls, each solder ball having a cross-section larger in diameter compared to those in the first and second BGA 130, 132, allowing for greater current carrying capacity near the central portions 125. Each of the solder balls in the third and fourth BGA 134, 136, can have diameters of about 5 mils to about 15 mils. The third and fourth BGA 134, 136, can increase reliability of the assembly 100. For example, the third and fourth BGA 134, 136, can withstand high current ($ICC_{max}$) operation.

Each of BGA 130, 132, 134, 136, can be connected to one or more contact pads 137 on surfaces 122, 124, of interposer 120. Vertical interconnects 138, 139, can be coupled to contact pads 137. Vertical interconnects 138 can run through interposer 120 to allow for first and second BGA 130, 132, to be connected to each other through interposer 120. Similar, vertical interconnects 139 can allow for third and fourth BGAs 134, 136, to be connected to each other through interposer 120. Contact pads 137 and vertical interconnects 138, 139, can be made of a conductive material such as copper or solder composites.

Interposer 120 can additionally include a shield layer 140 disposed on at least a portion of surfaces 122 and 124 of the interposer. Shield layer 140 can be disposed both on the major surfaces 122, 124, and/or within recesses 126, 128. Shield layer 140 can be coupled to vertical interconnect 138, 139 that are associated with a reference voltage, such as a ground reference voltage (Vas). Shield layer 140 can be electrically isolated from contact pads 137 through a dielectric layer 141, which can be molded. Shield layer 140 can provide a shorter current return path for signal transmission and minimize undesired energy (e.g., crosstalk) coupling between adjacent conductors.

Package substrate 145 can be, for example, a semiconductor package substrate hosting a semiconductor die such as die 150. Package substrate 145 can have first side 146 opposite second side 147, separated by a dielectric layer 148. Package substrate 145 can be connected to semiconductor die 150 through traces 149. In other arrangements, package substrate 145 can be a coreless substrate. Traces 149, and other pads or via, can allow for electrical connection from semiconductor die 150 through package substrate 145 to interposer 120 and finally to circuit board 110, and/or to other components mounted on circuit board 110.

Semiconductor die 150 can be mounted on package substrate 145. Die 150 can be, for example, a central processing unit (CPU), a platform controller hub/chipset die (PCH), a graphic processing unit (GPU), a memory die, a field programmable gate array (FGPA) or other semiconductor die. Semiconductor die 150 can be coupled to a first side of package substrate 145 through a plurality of solder bumps or other interconnects 152.

Figure 2A:
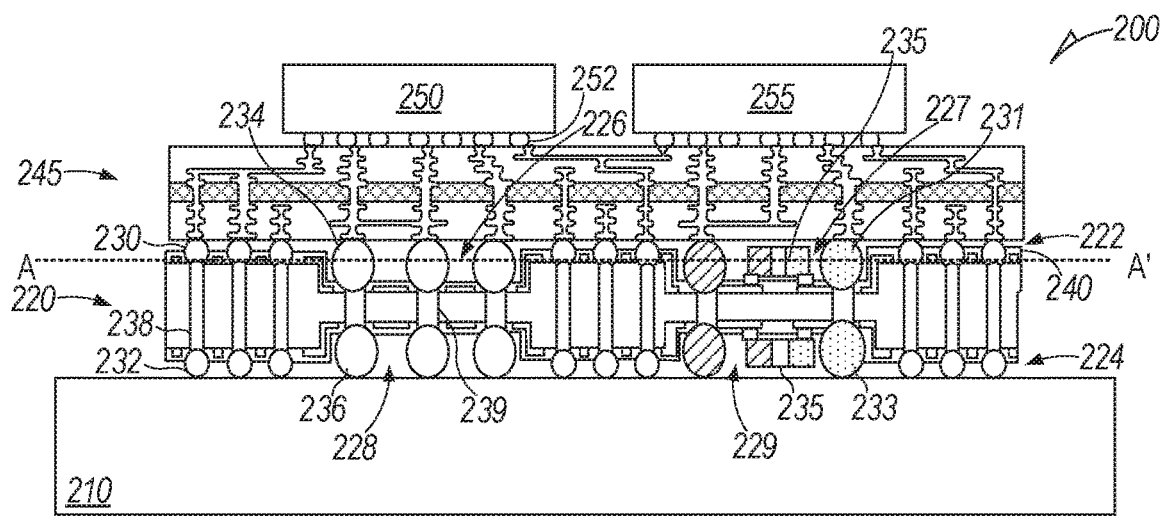
FIG. 2A-2B are schematic diagrams of a semiconductor package with stepped interposed design and recessed components in various embodiments.
Figure 2B:
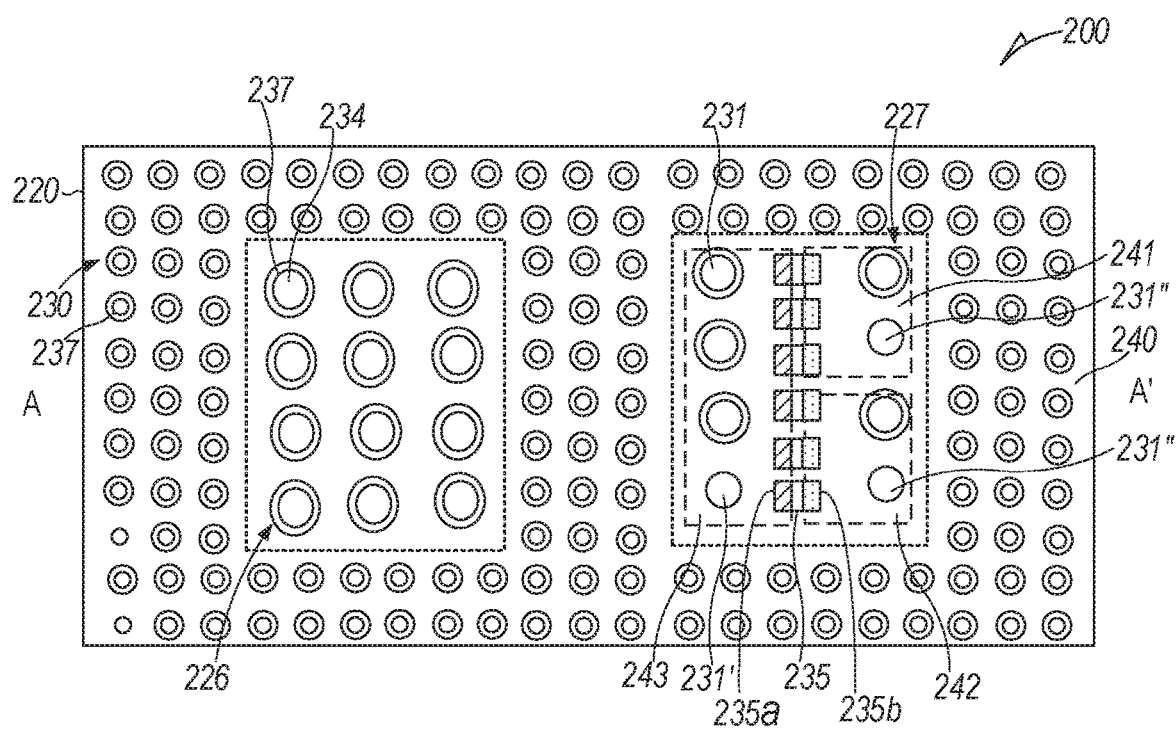

FIGS. 2A-2B are schematic diagrams of a semiconductor package 200 with stepped interposed design and recessed components in various embodiments. FIG. 2A shows semiconductor packages from a side view, while FIG. 2B shows semiconductor package 200 from a top-down view. The components of semiconductor package 200 can be similar in form and function as their counterparts described with reference to FIGS. 1A-1B above, except where otherwise noted.

Semiconductor package 200 includes circuit board 210, interposer 220, substrate package 245, and semiconductor dies 250, 255. Interposer 220 includes first side 222, with recesses 226, 227, and second side 224 with recesses 228, 229. Interposer 220 further includes small BGA 230, 232, large BGA 234, 236, and hybrid ball grid capacitor arrays 231, 233 including capacitors 235 with sides 235a and 235b. Interposer 220 additionally includes contact pads 237, vertical interconnects 238, 239, and shield layer 240, in addition to power planes 241, 242, and ground plane 243.

In semiconductor package 200, semiconductor dies 250, 255, are disposed on and coupled to package substrate 245. Package substrate 245 is connected to interposer 220 on first (land) side 222. Package substrate 245 is connected to circuit board 210 through various arrays 230, 232, 234, 236, 231, 233, and vertical interconnects 238, 239, in interposer 220. Interposer 220 is physically situated on circuit board 210. Circuit board 210 supports interposer 220, package substrate 245, and dies 250, 255.

Interposer 220 contains multiple recesses for accommodation of various interconnect arrays, some of which include solder balls having cross-sections with larger diameters. Like interposer 120 of semiconductor package 100 discussed above, interposer 220 allows for the usage of interconnect arrays of smaller size, such as BGA 230, 232, near keep-out zones (KOZ) and other areas where more tightly packed interconnect array are desired. However, the recesses 226, 227, 228, 229, in interposer 220, not only contain BGA having solder balls with cross-sections of larger diameter, but can also contain other components such as decoupling capacitors 235.

Semiconductor package 200 can include decoupling capacitors 235 disposed within recess 227 of interposer 220 interspersed with solder balls having cross-sections of larger diameter. Capacitors 235 can be, for example, multi-layer ceramic capacitors (MLCC). Each of capacitors 235 can be associated with a reference voltage. Each capacitor 235 can have a first terminal 235a and a second terminal 235b.

In one example reference capacitor, first terminal 235a can be coupled to a first conductive segment associated to a first reference voltage, such as a ground reference voltage ($V_{ss}$). In that example, second terminal 235b can be coupled to a second conductive segment associated to a second reference voltage, such as a power reference voltage ($V_{cc}$). The ground reference $V_{ss}$ and power reference $V_{cc}$ can, for example, come from circuit board 210 through interconnects 238, 239, BGA 231', 231" and/or contact pads 237, or alternatively from shield layer 240. One or more reference capacitors can be connected in the way shown in FIG. 2B.

In addition to a reference capacitor, a conductive capacitor can be coupled to the device. The terminals of that conductive capacitor can be coupled to one or more conductive segments in a similar fashion, such as a connection through vertical interconnects 238, 239, contact pads 237, and/or other traces or connections from circuit board 210. Several capacitors can be coupled to interposer 220 and package substrate 245 in this way, through power planes 241, 242, and ground plane 243 shown in FIG. 2B. Power planes 241, 242, can have, for example, a voltage of about 0.5 to about 3.3 volts, depending on system requirements.

Connecting capacitors 235 as described can increase power delivery efficiency and reduce power loop inductance. This can result in minimized power supply noise and fewer jitters in semiconductor package 200.

Figure 3:
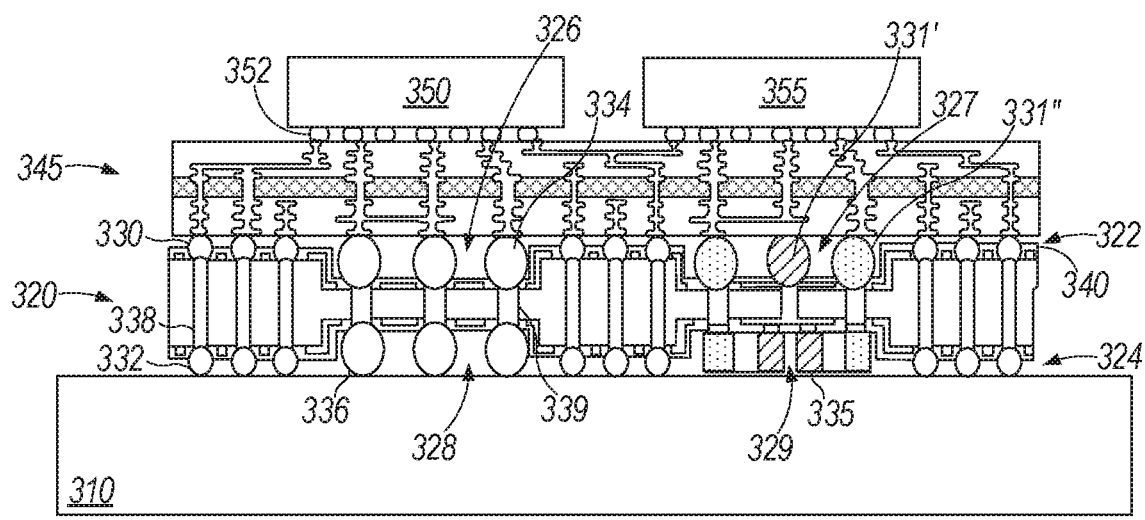
FIG. 3 is a schematic diagram of a semiconductor package with a stepped interposer design with recessed components in various embodiments.

FIG. 3 is a schematic diagram of a semiconductor package 300 with a stepped interposer design with recessed components in various embodiments. Semiconductor package 300 can include recessed passive components 335, such as decoupling capacitors. Recessed passive components 335 (e.g., decoupling capacitors) can allow for improved power integrity. The components of semiconductor package 300 can be similar in form and function as their counterparts described with reference to FIGS. 1A-1B and 2A-2B above, except where otherwise noted.

Semiconductor package 300 can include circuit board 310, interposer 320, substrate package 345, and semiconductor dies 350, 355. Interposer 320 includes first side 322, with recesses 326, 327, and second side 324 with recesses 328, 329. Interposer 320 further includes small BGA 330, 332, large BGA 334, 336, and hybrid BGA/passive component arrays 331', 331" with passive components such as decoupling capacitors 335 disposed within recess 329. Interposer 320 additionally includes contact pads 337, vertical interconnects 338, 339, and shield layer 340.

In semiconductor package 300, semiconductor dies 350, 355, are disposed on and coupled to package substrate 345. Package substrate 345 is connected to interposer 320 on first (land) side 322. Package substrate 345 is connected to circuit board 310 through various interconnect arrays 330, 332, 334, 336, and vertical interconnects 338, 339, in interposer 320. Interposer 320 is physically situated on circuit board 310. Circuit board 310 supports interposer 320, package substrate 345, and dies 350, 355.

Interposer 320 contains multiple recesses for accommodation of various interconnect arrays, some of which include solder balls having cross-sections with larger diameters. Interposer 320 allows for the usage of interconnect arrays of smaller size, such as BGA 330, 332, near keep-out zones (KOZ) and other areas where more tightly packed interconnect array are desired. However, the recesses 326, 327, 328, 329, in interposer 320, not only contain BGA having solder balls with cross-sections of larger diameter, but can also contain other components such as passive components. Specifically, hybrid arrays 331'. 331", can contain decoupling capacitors 335 at the opposing second side 324.

Hybrid arrays 331', 331" can includes both BGA with solder balls having cross-sections with large diameter, and one or more passive components such as decoupling capacitors 335 disposed within recess 329 at the opposing second side 324. In alternative examples, passive components can include, for example, inductors, resistors, other varieties of capacitors, and combinations thereof. Decoupling capacitors 335 can be, for example, multi-layer ceramic capacitors (MLCC) or silicon capacitors disposed within recess 329. Hybrid array 331' can be associated with a ground reference voltage (Vss) and coupled to a Vss terminal of the decoupling capacitor 335 through vertical interconnects such as 339. Hybrid array 331" can be associated with a power reference voltage (Vcc) and coupled to a Vcc terminal of the decoupling capacitor 335 through vertical interconnects such as 339.

Hybrid arrays 331', 331", coupled to the decoupling capacitor 335 through interposer 320, can allow for compact package geometry. Where passive component can be placed in recess 329, fewer passive components (e.g., decoupling capacitors) will need be placed in periphery or undesirable portions of the package 300. Due to this, the periphery portions of the package can potentially be reduced, as they are no longer needed to host a large number of passive components.

Figure 4A:
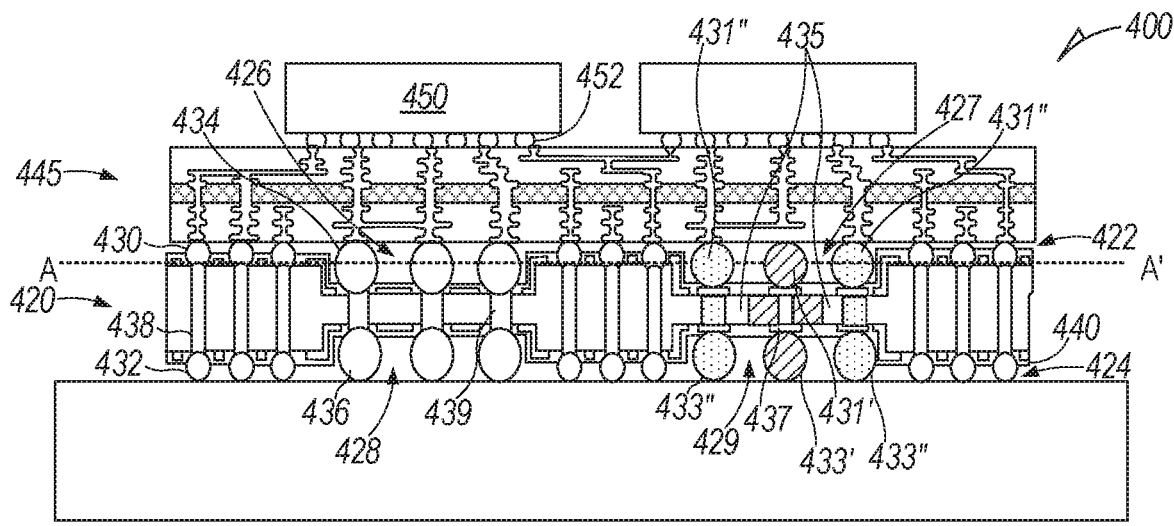
FIGS. 4A-4B are schematic diagrams of a semiconductor package with a stepped interposer design with embedded components in various embodiments.
Figure 4B:
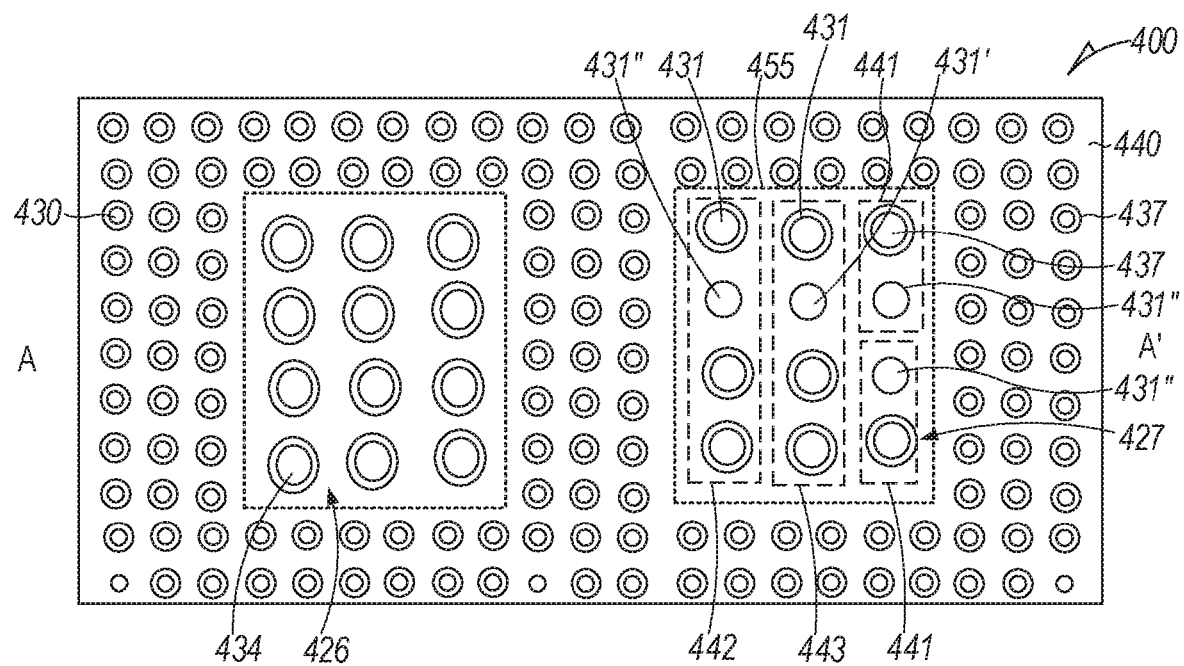

FIGS. 4A-4B are schematic diagrams of a semiconductor package 400 with a stepped interposer design with embedded components in various embodiments. FIG. 4A shows semiconductor packages from a side view, while FIG. 4B shows semiconductor package 400 from a top-down view. The components of semiconductor package 400 can be similar in form and function as their counterparts described with reference to FIGS. 1A-1B, 2A-2B, and 3 above, except where otherwise noted.

Semiconductor package 400 includes circuit board 410, interposer 420, substrate package 445, and semiconductor dies 450, 455. Interposer 420 includes first side 422, with recesses 426, 427, and second side 424 with recesses 428, 429. Interposer 420 further includes small BGA 430, 432, large BGA 431, 433, 434, 436, contact pads 437, vertical interconnects 438, 439, and shield layer 440, in addition to power planes 441, 442, and ground plane 443. In interposer 420, capacitors 435 can be embedded between recesses 427, 429, and can act to as vertical interconnects between BGA 431, 433.

In semiconductor package 400, semiconductor dies 450, 455, are disposed on and coupled to package substrate 445. Package substrate 445 is connected to interposer 420 on first (land) side 422. Package substrate 445 is connected to circuit board 410 through various arrays 430, 432, 434, 436, 431, 433, and vertical interconnects 438, 439, in interposer 420. Interposer 420 is physically situated on circuit board 410. Circuit board 410 supports interposer 420, package substrate 445, and dies 450, 455.

In semiconductor package 400, interposer 420 includes embedded passive components, decoupling capacitors 435, located between recess 427 and recess 429. Decoupling capacitors 435 can be, for example, MLCC or silicon capacitor. Decoupling capacitors 435 can serve to couple large BGA 431 to large BGA 433 through interposer 420. Specifically, a decoupling capacitor 435 can have first terminal 435a and second terminal 435b. First terminal 435a can be associated with a ground ($V_{ss}$) reference voltage. Second terminal 435b can be associated with a power ($V_{ss}$) reference voltage.

Where multiple capacitors are embedded, the ground terminals 435a can be coupled to a common ground ($V_{ss}$) segment. When aligned, the terminals of multiple capacitors 435a, 435b can create an array of power (Vcc) and ground (Vss) contact pads to accommodate large BGA 431, 433. BGA 431 can include BGA 431' associated with a ground reference voltage (Vss) and BGA 431" associated with a power reference voltage (Vcc). BGA 433 can include BGA 433' associated with a ground reference voltage (Vss) and BGA 433" associated with a power reference voltage (Vcc). Solder balls in large BGA 431, 433, such as BGA 431', 433' and BGA 431", 433" can be coupled to each other respectively through interposer 420 as desired.

Figure 5:
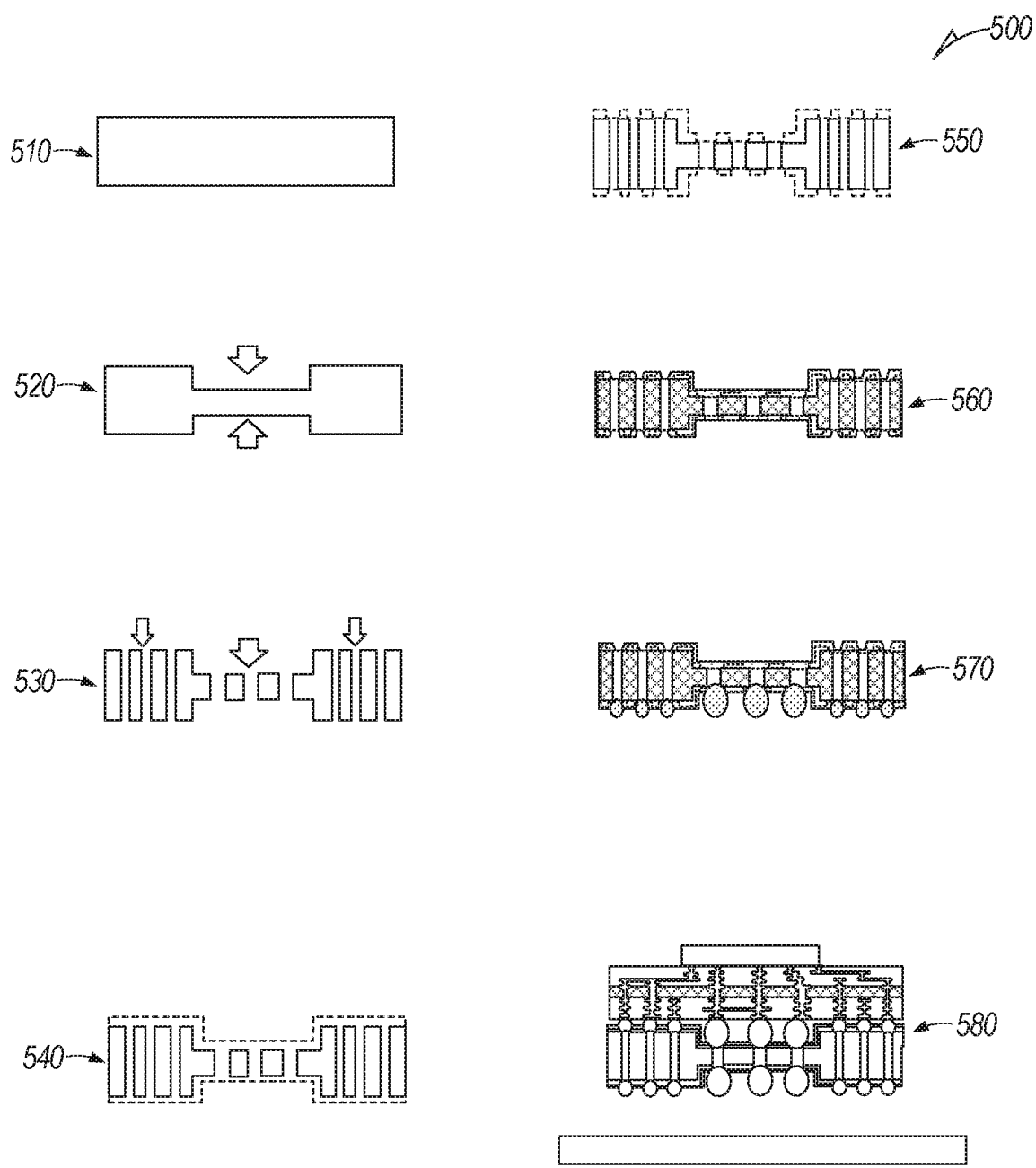
FIG. 5 is a schematic diagram of a method of making a semiconductor package with stepped interposer design in various embodiments.

FIG. 5 is a schematic diagram of a method 500 of making a semiconductor package with stepped interposer design in various embodiments. Method 500 can be used to make an interposer (e.g., interposer 120, 220, 320, or 420 described above) with hybrid BGA geometry and/or passive component coupling.

First, in step 510, a mold layer is created for the interposer. The mold layer can be made with, for example, an injection or compression molding process. Next, in step 520, the recesses in the interposer are made through mold removal. This can be done, for example, by a drilling or etching process.

In step 530, through mold openings are made for vertical interconnects. The through mold openings can be made, for example, by a drilling or etching process.

Subsequently, in step 540, a conductive layer can be disposed on the interposer material, on and through the mold openings. This can be done, for example, by electroless or electrolytic plating processes. The conductive layer can be patterned, for example, by an etching process in step 550.

Next, in step 560, a mold layer can be built up and pad openings can be created, such as, for example, by injection and/or compression molding, or an etching process.

In step 570, solder balls (or alternative types of interconnects) can be attached. Solder balls can be attached, for example, by surface mounting and a reflow process. The solder balls can optionally be backfilled.

Finally, in step 580, the interposer is used in assembly of the semiconductor package. The semiconductor die, mounted on a package substrate, can be attached to one side of the interposer through the solder balls. The circuit board (or other circuit board material) can be attached opposite the package substrate. The conductive layer in the through mold openings of the interposer can create an electrical connection between these components.

Figure 6:
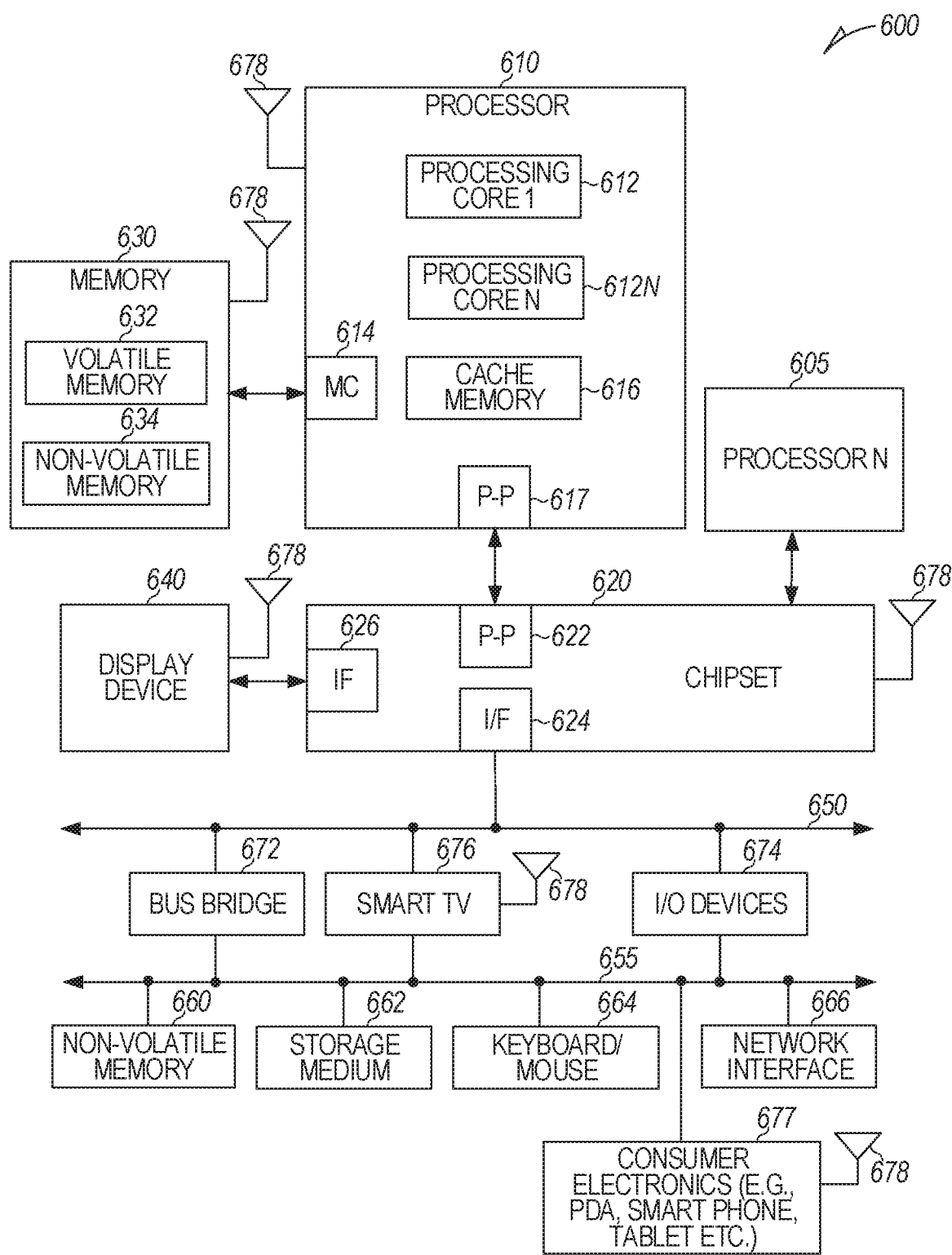
FIG. 6 shows a system that may incorporate a semiconductor package with stepped interposer and methods, in accordance with some example embodiments.

FIG. 6 illustrates a system level diagram, depicting an example of an electronic device (e.g., system) that may include a semiconductor package with stepped interposer and hybrid interconnect array and/or methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family. Home Plug AV (HPAV), Ultra-Wide Band (UWB), Bluetooth, WiMAX, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® Quick Path Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may include a semiconductor package with stepped interposer and hybrid interconnect array and/or methods as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as IO devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 includes a semiconductor device including: a substrate, a semiconductor die thereon, electrically coupled to the substrate, an interposer adapted to connect the substrate to a circuit board, the interposer having: a major surface, a recess in the major surface, a first plurality of interconnects passing through the interposer within the recess to electrically couple the substrate to the circuit board, a second plurality of interconnects on the major surface of the interposer to electrically couple the substrate to the circuit board, wherein each of the second plurality of interconnects comprises a smaller cross-section than some of the first plurality of interconnects.

Example 2 includes Example 1, wherein the first and second plurality of interconnects each comprise a ball grid array.

Example 3 includes any of Examples 1-2, wherein each of the first plurality of interconnects comprises a diameter of about 5 to about 15 mils, and wherein each of the second plurality of interconnects comprises a diameter of about 1 to about 4 mils.

Example 4 includes any of Examples 1-3, further including a shield layer in the interposer isolated from the first and second plurality of interconnects.

Example 5 includes any of Examples 1-4, wherein the interposer further comprises metallic traces, vertical via, metallic pads, or combinations thereof.

Example 6 includes any of Examples 1-5, wherein the second plurality of interconnects are on the major surface near one or more edges of the interposer.

Example 7 includes any of Examples 1-6, further including one or more passive components disposed in the recess.

Example 8 includes any of Examples 1-7, wherein the one or more passive components comprise one or more capacitors.

Example 9 includes any of Examples 1-8, wherein the one or more capacitors are coupled between a ground plane, and one or more power planes.

Example 10 includes any of Examples 1-9, wherein the one or more capacitors are at least partially embedded in the interposer.

Example 11 includes any of Examples 1-10, wherein the interposer further includes: a second surface opposite the major surface, the second surface proximate the circuit board, a second recess in the second surface, the second recess opposite the first recess, wherein the first recess is proximate the substrate, and the second recess is proximate the circuit board, a third plurality of interconnects in the second recess, wherein the first plurality of interconnects in the first recess are electrically coupled to the third plurality of interconnects in the second recess through the interposer.

Example 12 includes any of Examples 1-11, wherein the first plurality of interconnects in the first recess are electrically coupled to the third plurality of interconnects by a conductive layer including metallic traces, vertical via, metallic pads, or combinations thereof.

Example 13 includes any of Examples 1-12, wherein the first plurality of interconnects in the first recess are electrically coupled to the third plurality of interconnects by one or more capacitors.

Example 14 includes a method of making a semiconductor package including: forming an interposer with a recess, applying a conductive layer to the interposer, attaching a first set of solder balls to the conductive layer in the recess, attaching a second set of solder balls to the conductive layer outside the recess, and connecting a package substrate and semiconductor die to a circuit board with the interposer.

Example 15 includes Example 14, wherein the second set of solder balls each comprise a diameter smaller than that of the first set of solder balls.

Example 16 includes any of Examples 14-15, wherein forming the interposer further comprises forming a second recess opposite the first recess.

Example 17 includes any of Examples 14-16, further including attaching a third set of solder balls in the second recess opposite the first set of solder balls.

Example 18 includes any of Examples 14-17, further including coupling the first set of solder balls to the third set of solder balls by embedding a capacitor in the interposer between the first recess and the second recess.

Example 19 includes any of Examples 14-18, further including mounting one or more passive components in the first recess and coupling the one or more passive components to the semiconductor die through the interposer and the package substrate.

Example 20 includes any of Examples 14-19, further including mounting one or more capacitors in the first recess and coupling the interposer to the package substrate through the first and second sets of solder balls.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device comprising:
a substrate;
a semiconductor die thereon, electrically coupled to the substrate;
an interposer adapted to connect the substrate to a circuit board, the interposer comprising:
a major surface;
a recess in a central portion of the major surface;
a first plurality of interconnects passing through the interposer within the recess to electrically couple the substrate to the circuit board, wherein each of the first plurality of interconnects comprises a diameter of about 5 to about 15 mils;
a second plurality of interconnects on the major surface of the interposer to electrically couple the substrate to the circuit board, wherein each of the second plurality of interconnects comprises a smaller cross-section than some of the first plurality of interconnects, wherein each of the second plurality of interconnects comprises a diameter of about 1 to about 4 mils.

2. The device of claim 1, wherein the first and second plurality of interconnects each comprise a ball grid array.

3. The device of claim 1, further comprising a shield layer in the interposer isolated from the first and second plurality of interconnects.

4. The device of claim 1, wherein the interposer further comprises metallic traces, vertical via, metallic pads, or combinations thereof.

5. The device of claim 1, wherein the second plurality of interconnects are on the major surface near one or more edges of the interposer.

6. A semiconductor device comprising:
a substrate;
a semiconductor die thereon, electrically coupled to the substrate;
an interposer adapted to connect the substrate to a circuit board, the interposer comprising:
a major surface;
a recess in the major surface, one or more passive components disposed in the recess;
a first plurality of interconnects passing through the interposer within the recess to electrically couple the substrate to the circuit board;
a second plurality of interconnects on the major surface of the interposer to electrically couple the substrate to the circuit board, wherein each of the second plurality of interconnects comprises a smaller cross-section than some of the first plurality of interconnects.

7. The device of claim 6, wherein the one or more passive components comprise one or more capacitors.

8. The device of claim 7, wherein the one or more capacitors are coupled between a ground plane, and one or more power planes.

9. The device of claim 7, wherein the one or more capacitors are at least partially embedded in the interposer.

10. A semiconductor device comprising:
a substrate;
a semiconductor die thereon, electrically coupled to the substrate;
an interposer adapted to connect the substrate to a circuit board, the interposer comprising:
a major surface;
a recess in the major surface;
a first plurality of interconnects passing through the interposer within the recess to electrically couple the substrate to the circuit board;
a second plurality of interconnects on the major surface of the interposer to electrically couple the substrate to the circuit board, wherein each of the second plurality of interconnects comprises a smaller cross-section than some of the first plurality of interconnects,
a second surface opposite the major surface, the second surface proximate the circuit board;
a second recess in the second surface, the second recess opposite the first recess, wherein the first recess is proximate the substrate, and the second recess is proximate the circuit board;
a third plurality of interconnects in the second recess, wherein the first plurality of interconnects in the first recess are electrically coupled to the third plurality of interconnects in the second recess through the interposer.

11. The device of claim 10, wherein the first plurality of interconnects in the first recess are electrically coupled to the third plurality of interconnects by a conductive layer comprising metallic traces, vertical via, metallic pads, or combinations thereof.

12. The device of claim 10, wherein the first plurality of interconnects in the first recess are electrically coupled to the third plurality of interconnects by one or more capacitors.

* * * * *